(12) United States Patent
Artman et al.

(10) Patent No.: US 9,681,572 B2
(45) Date of Patent: Jun. 13, 2017

(54) SYSTEM WITH STEPPED THREE DIMENSIONAL PROFILE AND VENTING

(71) Applicant: Lenovo (Singapore) Pte. Ltd., New Tech Park (SG)

(72) Inventors: Paul Artman, Cary, NC (US); Andrew Thomas Junkins, Cary, NC (US); Rodrigo Samper, Raleigh, NC (US)

(73) Assignee: LENOVO (SINGAPORE) PTE. LTD, New Tech Park (SG)

( * ) Notice: Subject to any disclaimer, the term of this patent is extended or adjusted under 35 U.S.C. 154(b) by 15 days.

(21) Appl. No.: 14/674,388

(22) Filed: Mar. 31, 2015

(65) Prior Publication Data

US 2016/0295695 A1   Oct. 6, 2016

(51) Int. Cl.
 *H05K 7/14*   (2006.01)
 *G06F 1/18*   (2006.01)

(52) U.S. Cl.
 CPC ............ *H05K 7/1487* (2013.01); *G06F 1/18* (2013.01)

(58) Field of Classification Search
 CPC .... H05K 7/185; H05K 7/186; H05K 7/20254; G06F 1/185
 USPC ................... 361/679.46, 697, 702, 709, 741
 See application file for complete search history.

(56) References Cited

U.S. PATENT DOCUMENTS

| | | | |
|---|---|---|---|
| 6,431,765 B1* | 8/2002 | Chen .................... | G02B 6/4277 385/139 |
| 7,637,672 B1* | 12/2009 | Li ........................ | G02B 6/4201 385/92 |
| 2013/0077254 A1* | 3/2013 | Nguyen ............... | G02B 6/4261 361/715 |

* cited by examiner

*Primary Examiner* — Tuan T Dinh
*Assistant Examiner* — Mukund G Patel
(74) *Attorney, Agent, or Firm* — Dean D. Small; The Small Patent Law Group, LLC

(57) ABSTRACT

A system and method are provided that comprise a circuit board including one or more processors and a chassis that holds the circuit board. The chassis includes a card receptacle that receives an electronics card. The electronics card comprises a card circuit board having electronic components including one or more processors. The card circuit board has a chassis loading end. A heat sink is provided on the circuit board and thermally coupled to one or more electronic components to dissipate heat therefrom. The heat sink has a three-dimensional envelope having a stepped end profile relative to the chassis loading end. Vent openings are provided in shielding of the electronics card for airflow from the electronics card.

22 Claims, 8 Drawing Sheets

SYSTEM WITH STEPPED THREE DIMENSIONAL PROFILE AND VENTING

BACKGROUND

Embodiments of the subject matter described herein relate to pluggable electronics cards for use with computing assemblies.

Various types of computing assemblies exist today such as servers, laptop computers, desktop computers and the like. At least some convention computing assemblies include receptacles in the chassis that are shaped and dimensioned to receive various types of pluggable electronics cards. By way of example only, various types of input/output (I/O) cards can be plugged into receptacles in servers. The I/O cards connect to one or more circuit boards within the server. Examples of I/O cards or modules include peripheral component interconnect (PCI) cards, small form factor pluggable (SPF) cards and the like. The I/O cards connect to corresponding circuit boards within the server chassis in various manners. For example, some I/O cards mate in a co-planar configuration with a mother board such that the circuit boards of the I/O card and the motherboard are generally aligned in a common plane. Other I/O cards mate in a mezzanine configuration with a mother board such that the circuit board of the I/O card is located vertically above or below, and partially stacked on, the circuit board of the mother board. In co-planar configurations, the connector interface between the I/O card and mother board is generally in line with adjacent edges of the I/O card and mother board. In mezzanine configurations, the connector interface between the I/O card and mother board is oriented transverse to the surface of the I/O card and mother board such that the I/O card is positioned at least partially overlapping "on top" or "below" the mother board.

Today, computing assemblies are designated to include numerous types of I/O interfaces located proximate to one another in relatively small areas. For example, a server may include multiple rows of connector receptacles, where sets of connector receptacles in each row are provided on corresponding I/O cards. The I/O cards are connected at multiple locations (and in multiple orientations) to circuit boards within the server. Consequently, server assemblies (and other types of computing assemblies) have numerous specification limitations regarding various mechanical and performance characteristics of I/O cards. One mechanical specification limitation placed on I/O cards concerns the physical envelope or outer size dimensions of the I/O card. Each I/O card is provided a limited amount of real estate within the server chassis. Another specification limitation concerns the heat dissipation performance in order to avoid overheating the I/O card and the surrounding electronics. Another specification limit concerns electromagnetic interference (EMI) isolation in order to avoid EM interference between the various electronics.

SUMMARY

In accordance with at least one embodiment, a system is provided that comprise a main circuit board including one or more processors and a chassis that holds the main circuit board. The chassis includes a card receptacle that receives an electronics card. The electronics card comprises a card circuit board having electronic components including one or more processors. The card circuit board has a chassis loading end. A heat sink is provided on the card circuit board and thermally coupled to one or more electronic components to dissipate heat therefrom. The heat sink has a three-dimensional envelope having a stepped end profile relative to the chassis loading end.

Optionally, shielding may be provided on the electronics card where the shielding includes vent openings for airflow from the electronics card. The chassis may include a shroud surrounding the card receptacle, where the shroud includes vent apertures. The shielding is positioned to engage the shroud and the vent openings are positioned to align with the vent apertures in the shroud when the electronics card is fully loaded into the card receptacle into an electrically engaged relation with the main circuit board. Optionally, one or more receptacle ports are located at a connector mating end of the card circuit board. An electromagnetic interference (EMI) isolation shell is provided that includes a bottom shielding layer located proximate to the card circuit board. The EMI isolation shell includes an EMI cage at least partially surrounding the one or more receptacle ports.

In accordance with at least one embodiment, an electronics card is provided that comprises a circuit board having electronic components thereon. The circuit board has a chassis loading end. A heat sink is provided on the circuit board and thermally coupled to one or more electronic components to dissipate heat therefrom. The heat sink has a three-dimensional (3D) envelope having a stepped end profile relative to the chassis loading end.

Optionally, the stepped end profile may include first and second lateral sections extending different first and second heights above the circuit board. The first and second lateral sections may be separated from one another along a stepped edge extending in a direction corresponding to a longitudinal axis of the circuit board. Optionally, the heat sink includes a nonrectangular stepped end profile when viewed from the chassis loading end. The heat sink may include first and second block sections separated by a stepped edge extending in a direction of a longitudinal axis of the circuit board between the connector mating end and chassis loading end. The first and second block sections of the heat sink have different first and second heights extending upward from the circuit board.

Optionally, the electronic components may include input/output (I/O) conversion circuitry and the board connector may include a receptacle to mate with a motherboard. The board connector may mate with a motherboard in a coplanar arrangement such that the circuit board of the card and the motherboard are generally aligned in a common plane. Optionally, the card may further comprise an electromagnetic interference (EMI) isolation shell including a bottom shielding layer located proximate to the circuit board. The EMI isolation shell may include an EMI cage located at the connector mating end and at least partially surrounding the receptacle ports.

In accordance with at least one embodiment, a method is provided that comprises providing a circuit board having electronic components thereon, the circuit board having a chassis loading end. The method provides a heat sink on the circuit board and thermally couples the heat sink to one or more electronic components to dissipate heat therefrom, and forms the heat sink with a three-dimensional (3D) envelope having a nonrectangular stepped end profile relative to the chassis loading end.

In accordance with at least one embodiment, a system is provided that comprises a motherboard, a chassis that holds various electrical components including the motherboard, the chassis including a card receptacle; and an electronics card. The card comprises a circuit board having electronic components thereon, the circuit board having a chassis loading end and a connector mating end. Receptacle port is located at the connector mating end of the circuit board. Board connector is located at the chassis loading end of the circuit board. Heat sink is provided on the circuit board and thermally coupled to one or more electronic components to dissipate heat therefrom, wherein the heat sink has a three-dimensional (3D) envelope has a nonrectangular stepped end profile relative to the chassis loading end. The nonrectangular stepped end profile is shaped and dimensioned to fit into the card receptacle.

BRIEF DESCRIPTION OF THE DRAWINGS

The present subject matter will be better understood from reading the following description of non-limiting embodiments, with reference to the attached drawings, wherein below.

DETAILED DESCRIPTION

Figure 1:
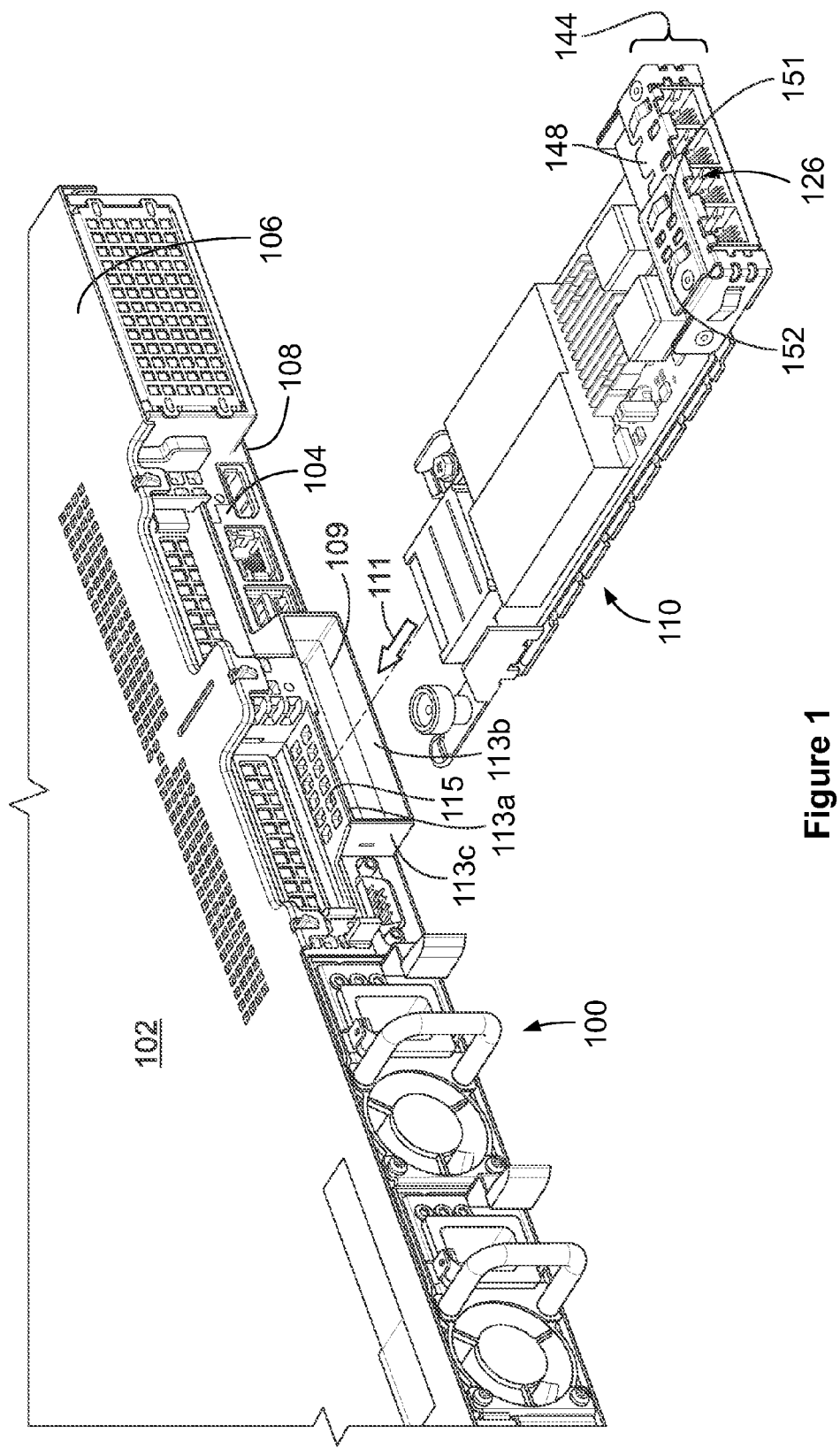
FIG. 1 illustrates a rear end perspective view of the electronic system with the electronics card removed in accordance with embodiments herein.

FIG. 1 illustrates a rear end perspective view of an electronics system 100 with an electronics card 110 removed and aligned to be loaded into the system 100. The system 100 includes a chassis 102 that holds various electrical components. The chassis 102 includes upper and lower walls 106 and 108, as well as a rear end wall 104. The rear end wall 104 includes various openings there through that are shaped and dimensioned to receive various connectors, electronics and other components in connection with the operation of the system 100. The rear end wall 104 includes multiple card receptacles, such as card receptacle 109 shaped and dimensioned to receive electronics card 110 in accordance with embodiments herein.

The card receptacle 109 includes an interior envelope having a predetermined height and width that represent overall dimensions, within which the electronics card 110 is loaded into the chassis 102. The electronics card 110 is loaded in the direction of arrow 111 until mating with one or more electrical interfaces within the chassis 102. The card 110 includes multiple connector receptacles that permit an equal number of connectors to be connected to the system 100. For example, the card 110 may support four or more Ethernet or network connections, as denoted by receptacle ports 126. By way of example only, the card 110 may represent an SFP card, an I/O card and the like. In accordance with at least one embodiment, the card 110 may represent an SFP or PCI card that, when loaded in the direction of arrow 111, is plugged directly into, and electrically mates, an end of a main circuit board, which may represent a motherboard, within the system 100 as explained herein in more detail.

Figure 2:
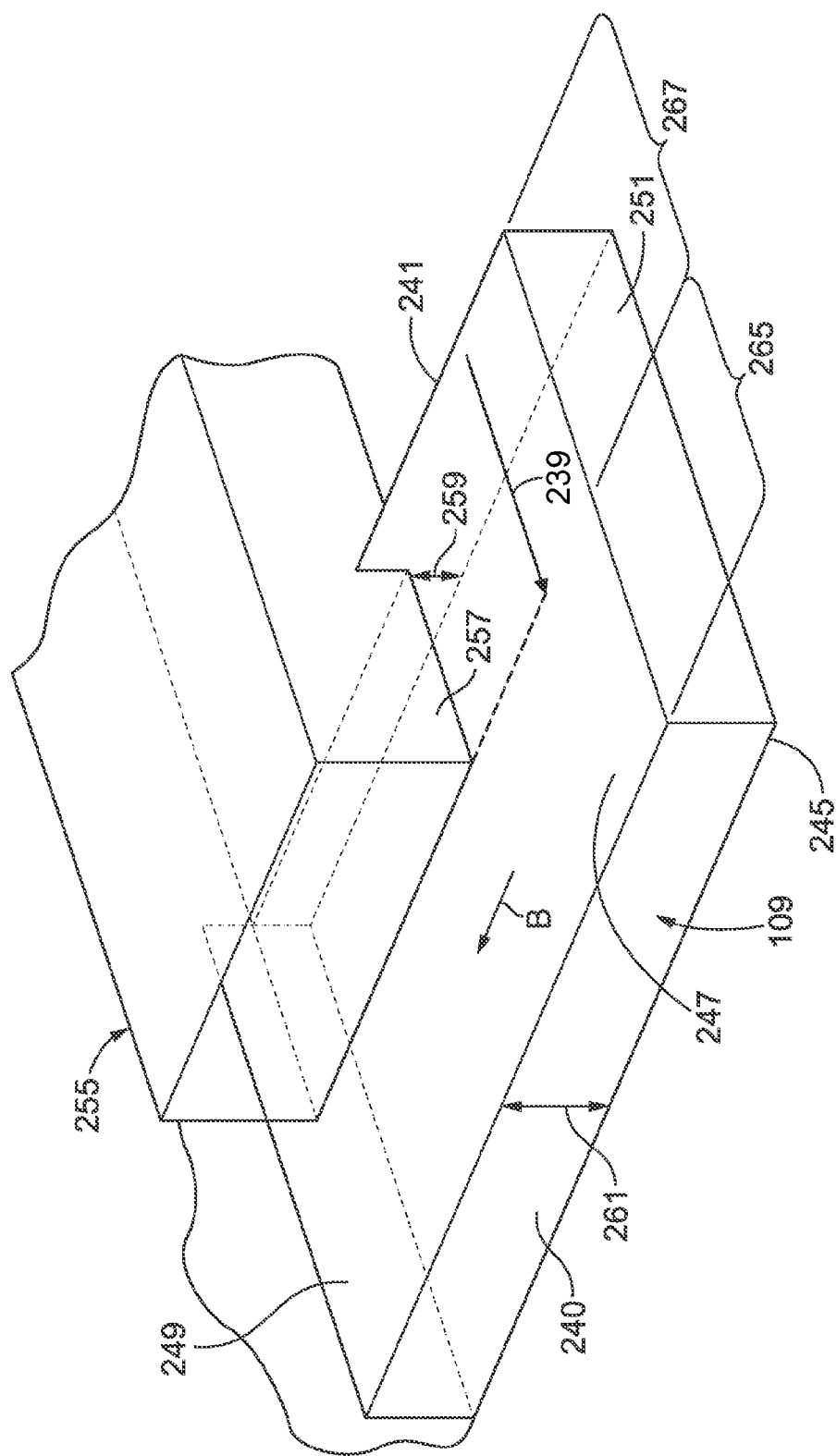
FIG. 2 illustrates a perspective model of the card receptacle in accordance with embodiments herein.

FIG. 2 illustrates a perspective model of an interior envelope of the card receptacle 109. The interior envelope of card receptacle 109 is defined by boundary constraints that are conceptually illustrated in FIG. 2 as sides 240 and 241, bottom 245, top 247, rear end 249 and front 251. It should be recognized that the boundary constraints for the sides, top, bottom, rear end and front 240-251 may or may not necessarily represent solid surfaces within the chassis 102. Instead, the sides, top, bottom, rear end and front 240-251 represent limits set forth in a specification defining the overall dimensions that a card must satisfy to be approved to be used with the server system 100. In general, the sides, top, bottom, rear end and front 240-251 correspond to, or are based on, the outer limits of surrounding components or spaces assigned to other electronic components or cards within the chassis 102. For example, other electronic components/cards may be positioned on opposite sides of the card receptacle 109 (proximate to the sides 240 in 241). Similarly, other electronic components/cards may be positioned immediately below and above the card receptacle 109 (proximate to the bottom 245 and top 247). The envelope of the card receptacle 109 is un-even or non-rectangular in that the envelope represents a non-uniform three-dimensional shape.

In the example of FIG. 2, the non-uniform three-dimensional shape of the card receptacle 109 is caused by at least one other component/card that fits into region 255. The region 255 may represent an area allocated to another electrical card, such as a mezzanine card that is positioned to be attached to a top of the same circuit board as the card 110 inserted into the card receptacle 109. By way of example only, a PCI card may be constructed as a mezzanine card that is attached to the top of a main circuit board (e.g., motherboard) and fitted within the region 255. The region 255 includes an interfering portion 257 that extends downward through the top 247 of the card receptacle 109. The interfering portion 257 extends laterally a partial distance across the width 239 of the card receptacle 109 such that a height 259 of the card receptacle 109 at side 241 (below the interfering portion 257) is less than a height 261 of the card receptacle 109 along the opposite side 240. It should be recognized that the example of FIG. 2 is merely one example and that the shape of the receptacle 109, the region 255 and interfering portion 257 may vary. It should also be recognized that the location, orientation, dimensions and the like of the region 255 and interfering portion 257 may vary.

As explained herein, electronics cards 110 are constructed with components therein defining a three-dimensional envelope having a nonrectangular stepped end profile. The components, defining the three-dimensional envelope, have first and second lateral sections separated from one another along a direction corresponding to a longitudinal axis of the device where the first and second lateral sections have different first and second heights. Relative to the example of FIG. 2, the first lateral section of the card 110 has a height generally corresponding to height 261 dimensioned to fit within the lateral section 265 when loaded in the direction of arrow B. The second lateral section of the card 110 has a height generally corresponding to the height 259 dimensioned to fit within the lateral section 267 below the interfering portion 257.

Figure 3:
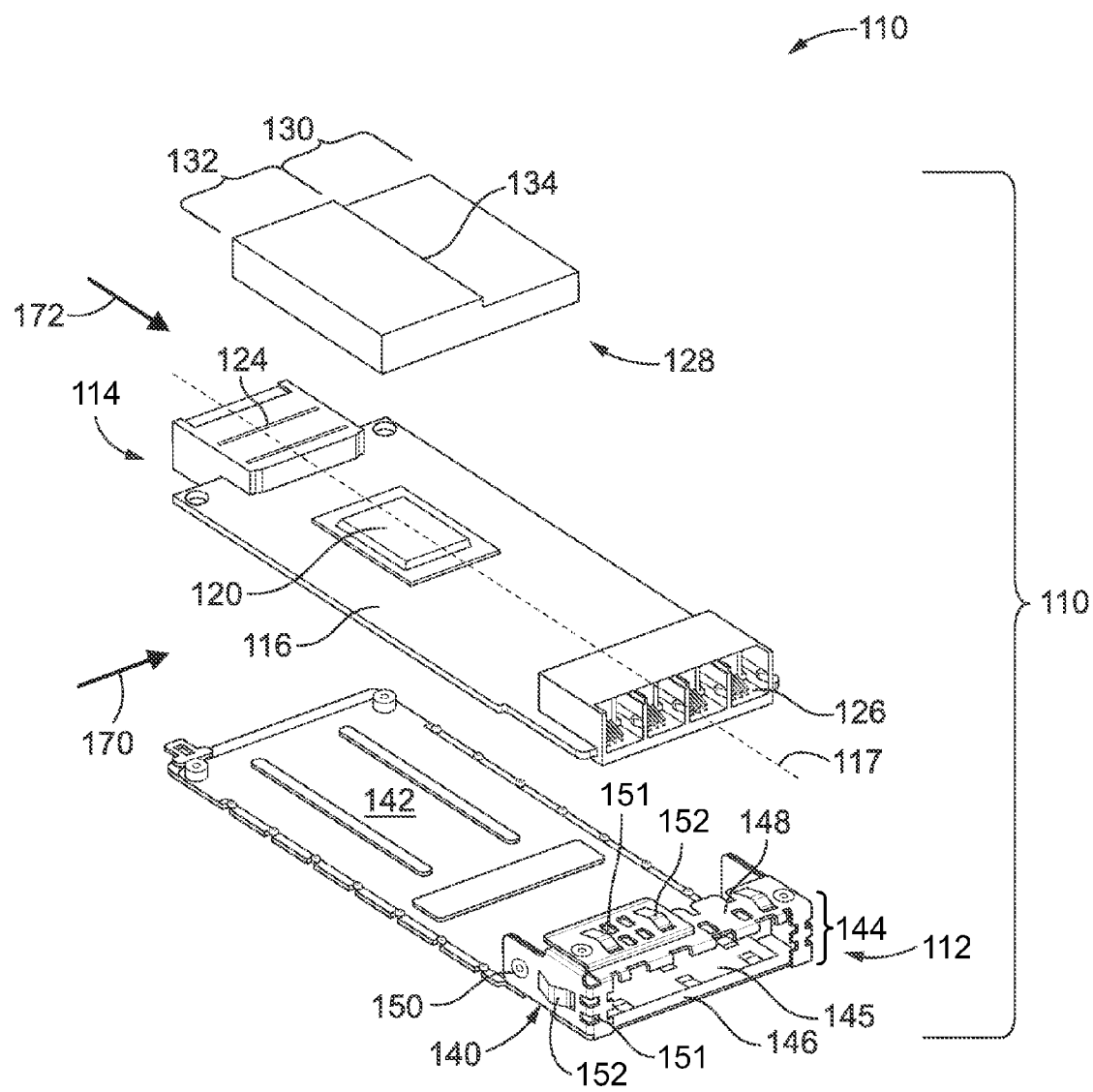
FIG. 3 illustrates an exploded side perspective view of the electronics card in accordance with embodiments herein.

FIG. 3 illustrates an exploded side perspective view of the electronics card 110. The card 110 includes various components and structures depending in part upon the electrical functions to be performed by the card 110. In the example of FIG. 3, only a portion of the components within the card 110 are illustrated, for simplification reasons. It is understood that additional or alternative components may be provided upon the card 110 based on the functions to be performed.

The card 110 comprises a card circuit board 116 that has electronic components thereon, with the electronic components including one or more processors. By way of example, the electronic components may include signal processing circuitry 122 (FIG. 5), an ASIC 120 and the like. The card circuit board 116 and card 110 have a connector mating end 112 and a chassis loading end 114. The chassis loading end 114 represents the first portion of the card 110 that is loaded into the card receptacle 109. One or more receptacle ports 126 are located at the connector mating end 112 and mounted on the circuit board 116. The receptacle ports 126 may be formed in various manners in accordance with various standards or connector formats. By way of example only, the receptacle ports 126 may be formed to receive RJ-45 connectors, SFP connectors and the like.

A board connector 124 is located at, and mounted on, the chassis loading end 114 of the circuit board 116. The board connector 124 is shaped and dimensioned to engage contacts at an electrical interface on a circuit board within the chassis 102. The circuit board 116 is elongated along a longitudinal axis 117 with the board connector 124 and receptacle ports 126 located along the longitudinal axis 117.

The card 110 is loaded in the direction of the arrow 111 in FIG. 1 into the open front of the card receptacle 109. The chassis loading end 114 is loaded first into the card receptacle 109, with the card 10 following, until the chassis loading end 114 abuts against and physically/electrically mates with another circuit board. When the card 110 is fully plugged into the card receptacle 109, the connector mating end 112 is located generally flush with the shroud 113 on the rear wall of the chassis and the receptacle ports 126 are exposed to mate with corresponding connectors.

A heat sink 128 is provided on the circuit board 116 at a position that is thermally coupled to one or more of the electronic components provided on the circuit board 116. For example, the heat sink 128 may be positioned upon and thermally coupled to one or more processors, such as the ASIC 120. The heat sink 128 dissipates heat from the electronic components thermally coupled thereto through three dimensional venting.

Various components within the card 110 collectively define a three-dimensional (3-D) envelope or perimeter of the card 110. The three-dimensional envelope is characterized by various shapes and dimensions when the card 110 is viewed from different directions. For example, the 3-D envelope of the card 110 exhibits a first profile (also referred to as a side or lateral profile) when viewed from a lateral or side position, such as from the side viewing direction 170. The 3-D envelope of the card 110 exhibit a second profile (also referred to as an end profile or loading end profile) when viewed from the loading end, such as from the loading end viewing direction 172. As explained herein, the 3-D envelope may be defined at least in part by the board connector 124 and/or the heat sink 128 to have a nonrectangular stepped end profile as viewed from (or relative to) the chassis loading end 112.

The card 110 further includes electromagnetic interference (EMI) shielding proximate to select regions of the card 110. In some embodiments, the EMI shielding includes an EMI isolation shell 140 provided upon one or more of the sides, ends, top, and bottom of the card 110. The EMI isolation shell 140 includes a bottom shielding layer 142 having a generally planar surface that is shaped and dimensioned to substantially match the length and width of the circuit board 116. In some embodiments, the EMI shielding includes, as part of the isolation shell 140, an EMI cage 144 located at the connector mating end 112 and mounted on the bottom shielding layer 142. The EMI cage 144 has an opening 145 there through that receives one or more receptacle ports 126. The EMI cage 144 is defined by a bottom shielding strip 146, a top shielding strip 148 and side shielding strips 150 that surround the opening 145 and are positioned to substantially abut against bottom, top and side surfaces of the receptacle ports 126. EMI clips 152 are snapped into apertures (e.g., vent openings 151) in one or more of the bottom, top and side shielding strips 146, 148 and 150. The EMI clips 152 project outward beyond the shielding strips 146-150 and are configured to electrically engage the chassis enclosure surface 113 surrounding the opening to the card receptacle 109 to form a conductive connection between the EMI isolation shell 140 and the chassis 102. The EMI clips 152 may be constructed in a spring-loaded manner to bias outward from the corresponding shielding strips 146-150, while being flexible to frictionally and electrically engage the shroud 113 when the card 110 is loaded into the card receptacle 109. Optionally, the EMI isolation shell 140 may be constructed in various manners to surround various select surfaces, sides or regions of the card 110.

Figure 4:
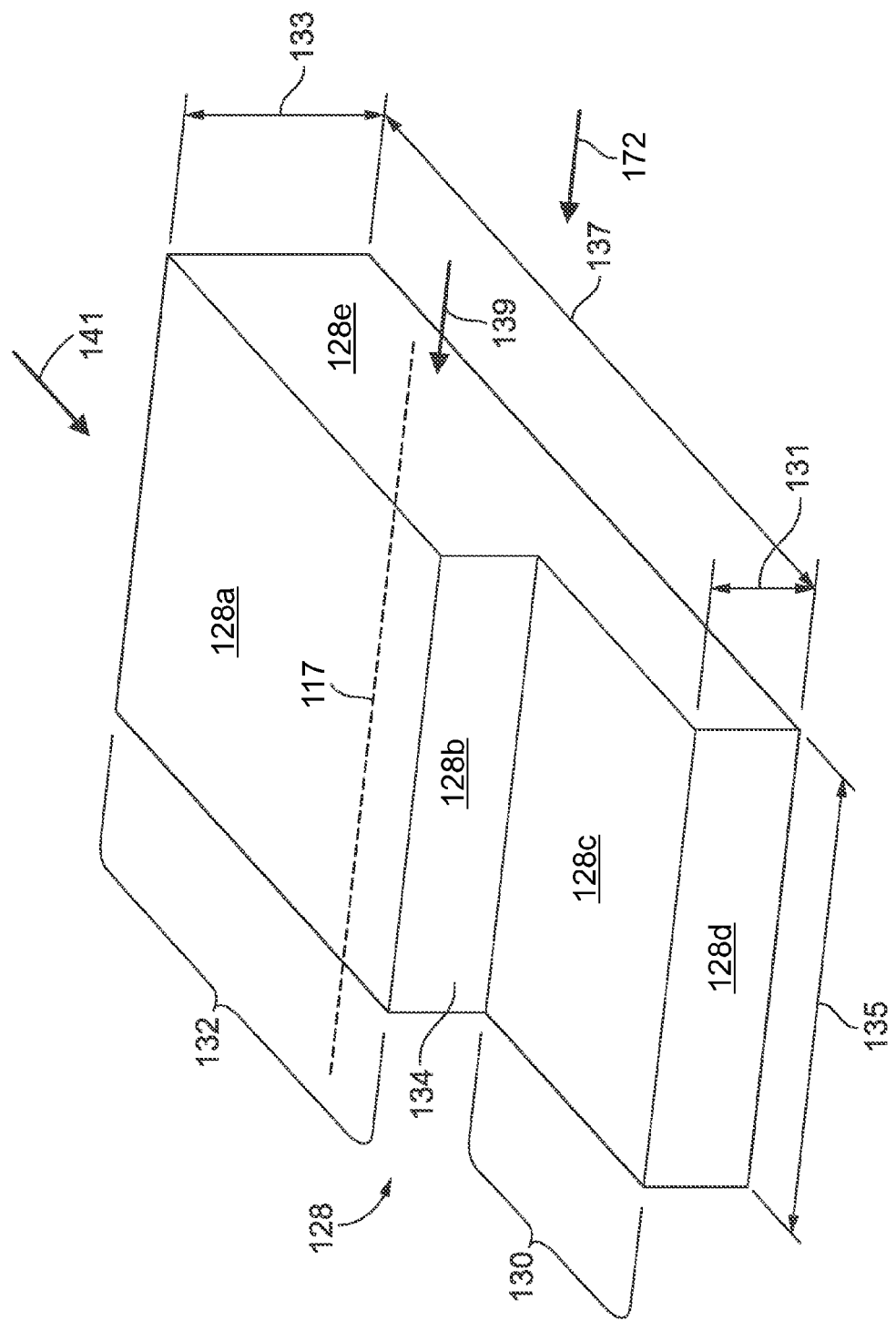
FIG. 4 illustrates an isometric view of a heat sink formed in accordance with an embodiment herein.

FIG. 4 illustrates an isometric view of a heat sink 128 formed in accordance with an embodiment herein. The heat sink 128 includes an uneven or step end profile (as viewed from the loading end viewing direction 172 or the chassis loading end 114). For example, the heat sink 128 may include block sections 130 and 132 separated at a stepped edge 134. The heat sink 128 includes a raised block section 132 and a sunken or lowered block section 130 that are separated at the stepped edge 134. The lower or sunken block section 132 has a height 131, while the raised block section 132 has a height 133, where the height 133 is greater than the height 131. The heat sink 128 includes a length 135 extending in a direction generally parallel to the longitudinal axis 117 of the card 110 (FIG. 3). The heat sink 128 has a lateral width 137 traversing at least a portion of the circuit board 116. The envelope of the heat sink 128 may be configured in various manners to afford different end and side profiles, such as a heat sink end profile as viewed in the direction of arrow 139 or a side profile as viewed in the direction of arrow 141.

The end and side profiles 139 and 141 and the corresponding overall envelope may be adjusted based upon the available space within the chassis 102 of the system 100. For example, when the card 110 is inserted into card receptacles 109 for different systems 100, interior portions of the envelope within the card receptacle 109 may vary along the loading direction (corresponding to arrow 111). Accordingly, the shape, dimension and location of the block sections 130 and 132 may be varied to match the interior envelope of the card receptacle 109.

In accordance with embodiments herein, the stepped 3-D envelope, as defined by one or more of the electrical components, structures, connectors, heat sinks and the like, provides various benefits. For example, increasing the height of the heat sink and one or more other components increases the mechanical strength of the overall card structure. As another example, providing a heat sink with a stepped exterior surface affords added surface area (e.g., in regions 128A-E) on the heat sink to increase a heat dissipation capacity of the heat sink. As another example, the stepped envelope maintains a desired amount of EMI isolation while the stepped exterior surface of the heat sink also allows for increased three-dimensional venting of the heat.

Figure 5:
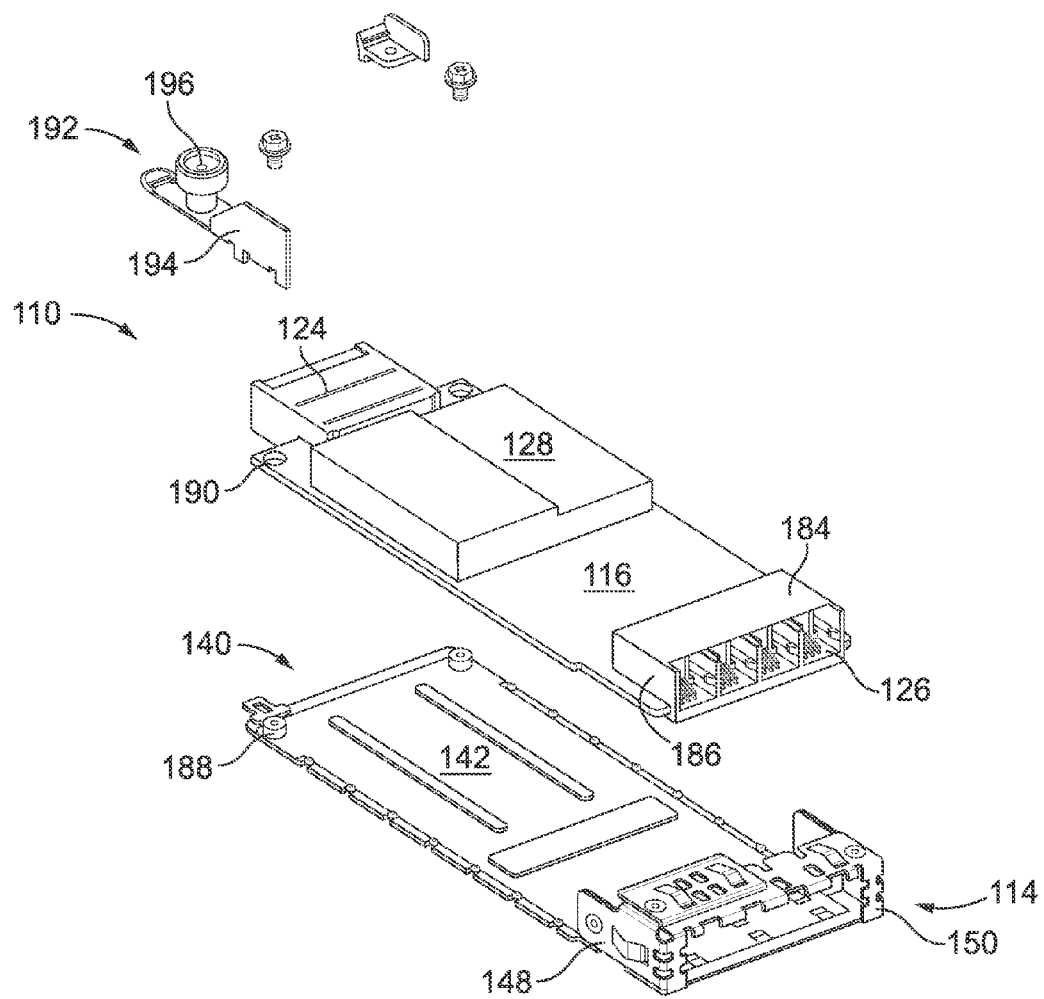
FIG. 5 illustrates an exploded view of the card with the heat sink mounted on the printed circuit board in a position that thermally couples the heat sink to electronic components of interest in accordance with embodiments herein.

FIG. 5 illustrates an exploded view of the card 110 with the heat sink 128 mounted on the printed circuit board 116 in a position that thermally couples the heat sink 128 to electronic components of interest, such as the ASIC 120. In FIG. 5, the heat sink 128 is placed over and covers up the ASIC 120. The receptacle ports 126 have a port top surface 184 and port side surfaces 186. The receptacle ports 126 fit into the opening 145 in the EMI cage 144 such that the port top and side surfaces 184 and 186 rest within and are located immediately adjacent the top and side shielding strips 148 and 150. The bottom shielding layer 142 covers the bottom surface of the circuit board 116. Optionally, posts 188 may be provided on the bottom shielding layer 142 and positioned to align with holes 190 in the printed circuit board 116, when the receptacle ports 126 are slid into the EMI cage 144, to facilitate alignment and attachment between the EMI isolation shell 140 and the circuit board 116.

FIG. 5 also illustrates a fixation mechanism 192 that is mounted on the circuit board 116 proximate to the chassis loading end 114 and along one side, or edge of the card 110. The fixation mechanism 192 includes a bracket 194 that holds a locking element 196. By way of example, the locking element 196 may represent a screw or other rotatable latching feature. An upper end of the locking element 196 may include a recess configured to receive a locking tool, such as a screwdriver head. During assembly, the card 110 is loaded into the chassis 102 to a desired position at which the board connector 124 electrically and securely mates with a motherboard or other circuit board. Once the card 110 is fully engaged with the motherboard, the locking element 196 aligns with a corresponding mating locking feature on the motherboard or elsewhere in the chassis. By rotating the locking element 196, the locking element 196 engages the mating locking feature on the motherboard. Optionally, the locking element 196 may represent a spring push pin assembly or other type of assembly.

Figure 6:
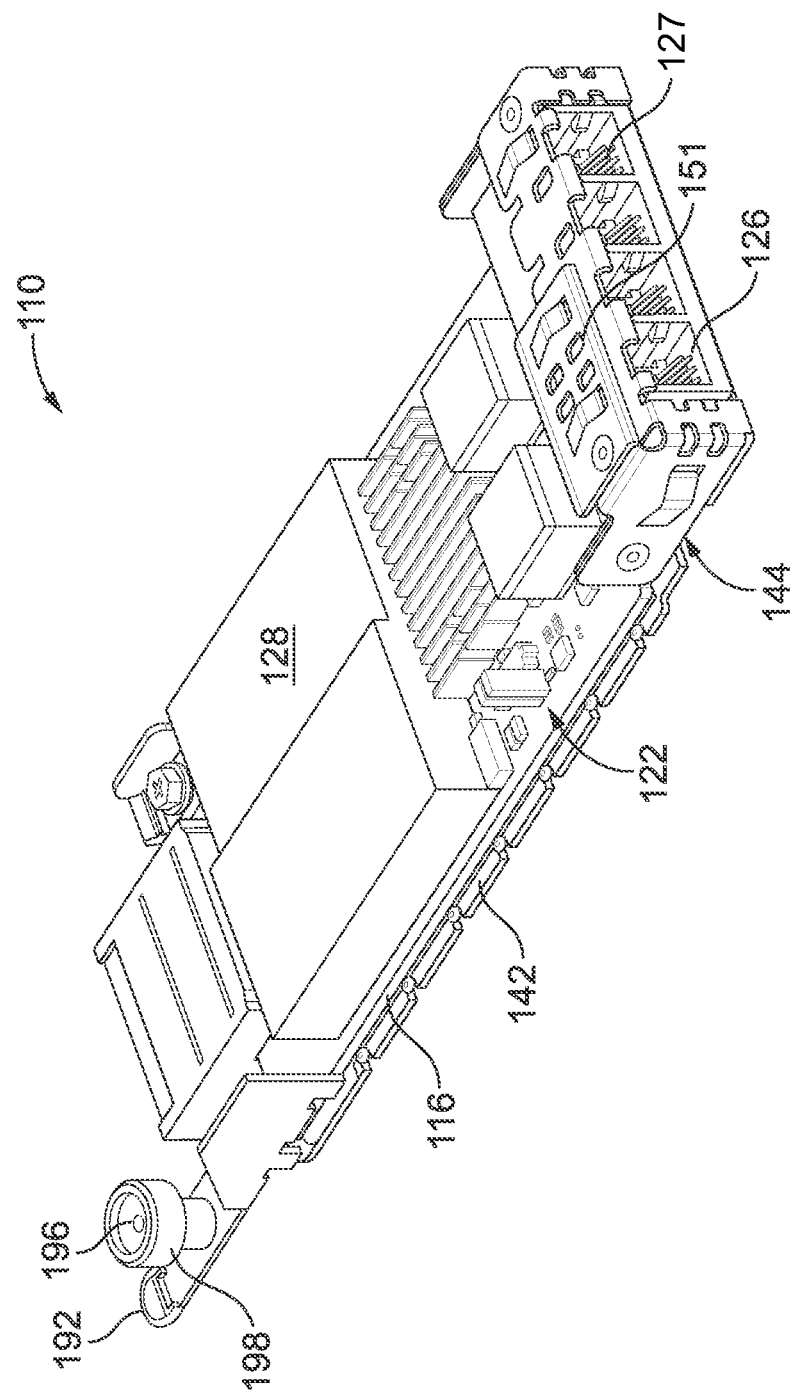
FIG. 6 illustrates a top perspective view of the card with all of the corresponding components assembled in accordance with an embodiment herein.

FIG. 6 illustrates a top perspective view of the card 110 with at least a portion of the corresponding components assembled in accordance with an embodiment herein. As shown in FIG. 6, the bottom shielding layer 142 is mounted against the circuit board 116. The receptacle ports 126 are loaded into the EMI cage 144. The heat sink 128 is mounted over corresponding select components. The fixation mechanism 192 is mounted on the card 110, such as along a lateral side edge of the shielding layer 142. As better illustrated in FIG. 6, the fixation mechanism 192 includes a peripheral washer 198 surrounding a Phillips type screwdriver receptacle in the locking element 196. The washer 198 helps prevent a screwdriver head or other tool from sliding sideways off of the locking element 196 (and inadvertently damage other components on the motherboard) while using the tool to screw the locking element 196 into the motherboard.

FIG. 6 also illustrates additional electrical components provided on the circuit board 116. For example, signal processing circuitry 122 may be provided that is electrically connected to signal paths extending from the contacts 127 within the receptacle ports 126. The signal processing circuitry 122 may perform various types of signal processing upon signals received from and conveyed to the receptacle ports 126.

Figure 7:
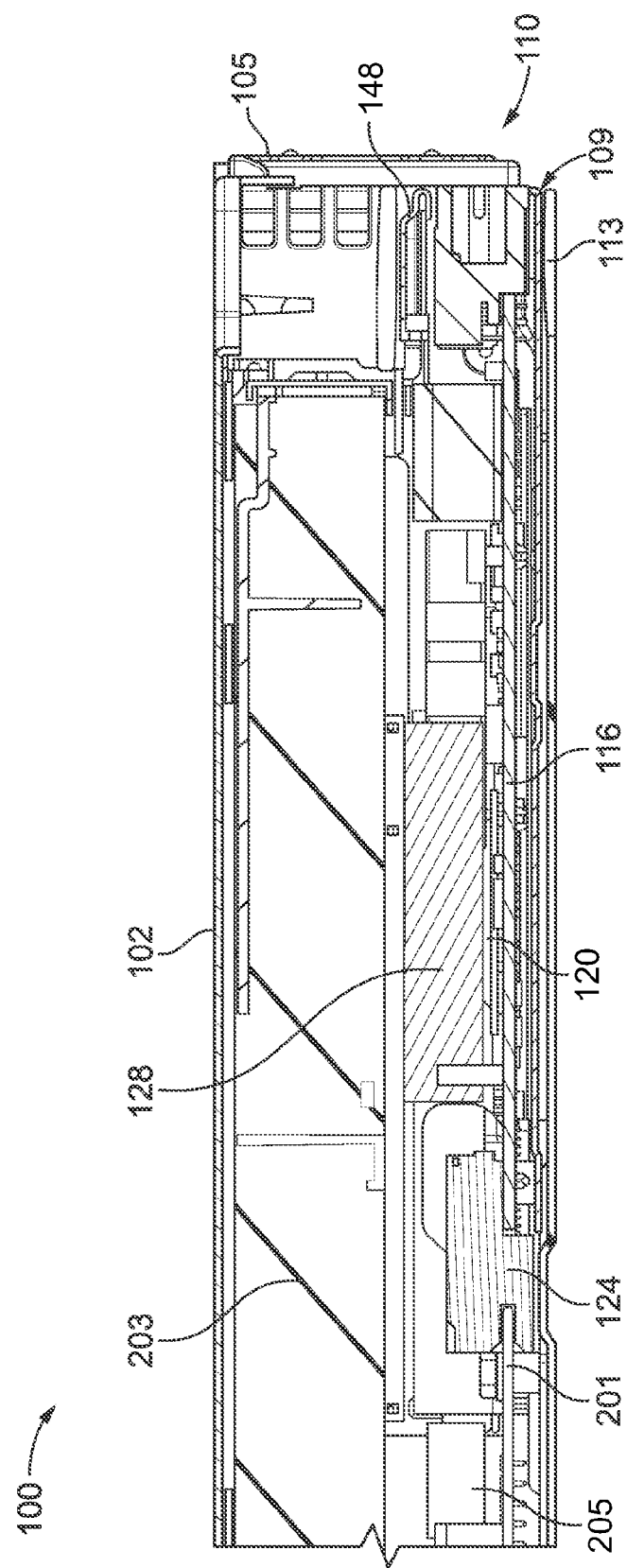
FIG. 7 illustrates a side view of a portion of the system with a card loaded into a card receptacle in a rear end of a chassis in accordance with embodiments herein.

FIG. 6 further illustrates additional details of the venting features of the EMI shielding, such that the shielding provides ventilation airflow for the electronics card 110 through the chassis. The EMI cage 144 is defined by the bottom shielding strip 146, top shielding strip 148 and side shielding strips 150. The top shielding strip 148 includes a plurality of vent openings 151 that are distributed across the strip 148. Additionally or alternatively, the side and bottom shielding strips 146 and 150 may include vent openings 151. The top shielding strip 148 extends from the connector mating end 112 along the receptacle ports 126. The top shielding strip 148 is spaced apart from the upper surface of the receptacle ports 126 to provide an air flow path along the exterior surfaces of the receptacle ports 126 through the vent openings 151. The vent openings 151 align with the corresponding vent apertures 115 in the shroud 113. The shielding is positioned to engage the shroud and the vent openings 151 are positioned to align with the vent apertures 115 in the shroud 113 when the electronics card 110 is fully loaded into the card receptacle into an electrically engaged relation with the main circuit board 201 (FIG. 7). The vent openings 151 and vent apertures 115 allow airflow (through the chassis) into and out of the card receptacle area surrounding the electronics card 110. The vent openings 151 and vent apertures 115 allow airflow to pass along the heat sink 128.

With combined reference to FIGS. 1 and 6, when the EMI cage 144 is loaded into the shroud 113, the EMI cage 144 abuts against and is electrically common with the shroud 113 at the rear end 105 of the chassis 102. The shroud 113 includes top wall 113a, bottom wall 113b and side walls 113c. One or more of the top, bottom and side walls 113a, 113b, and 113c includes vent apertures 115 distributed along a surface thereof. The vent apertures 115 are spaced to align with vent openings 151 in the EMI shield 144 provided on the electronics card 110 when the electronics card 110 is loaded into the chassis. The vent apertures 115 and vent openings 151 enable air to flow from the area surrounding the electronic components outward through the shroud 113 at the connector mating end 112 of the card 110 to further facilitate venting and heat discharge. Optionally, various combinations of vent openings 151 may be provided at numerous locations within the EMI shielding. In one embodiment, one or more of the top, bottom and side walls 113a, 113b, and 113c protrude rearward from the rear end 105 of the chassis 102. The protrusion provides additional surface area which in turn further facilitates venting and heat discharge.

FIG. 7 illustrates a side view of a portion of the system 100 with the card 110 loaded into the card receptacle 109 through a rear end 105 of the chassis 102. In FIG. 7, the printed circuit board 116 is illustrated to align in a coplanar arrangement with a motherboard 201. The motherboard 201 represents a main circuit board that includes one or more main processors 205. The main processors 205 may perform all or portions of functions associated with various electronic systems, such as server related operations and the like. Contacts on the motherboard 201 are connected through the board connector 124 to corresponding contacts on the circuit board 116. The electronic components, such as one or more processors (that are included within or provided separate from the ASIC 120), are accessible by the one or more main processors 205. Within the chassis 102, a PCI card 203 is mounted to a top surface of the motherboard 201 and extends into a region above the card receptacle 109. With reference to FIG. 2, the PCI card 203 fits into the region 255 and the interfering portion 257. The heat sink 128 has a height that is dimensioned to fit below the bottom surface of the PCI card 203 (corresponding to height 259 in FIG. 2).

Figure 8:
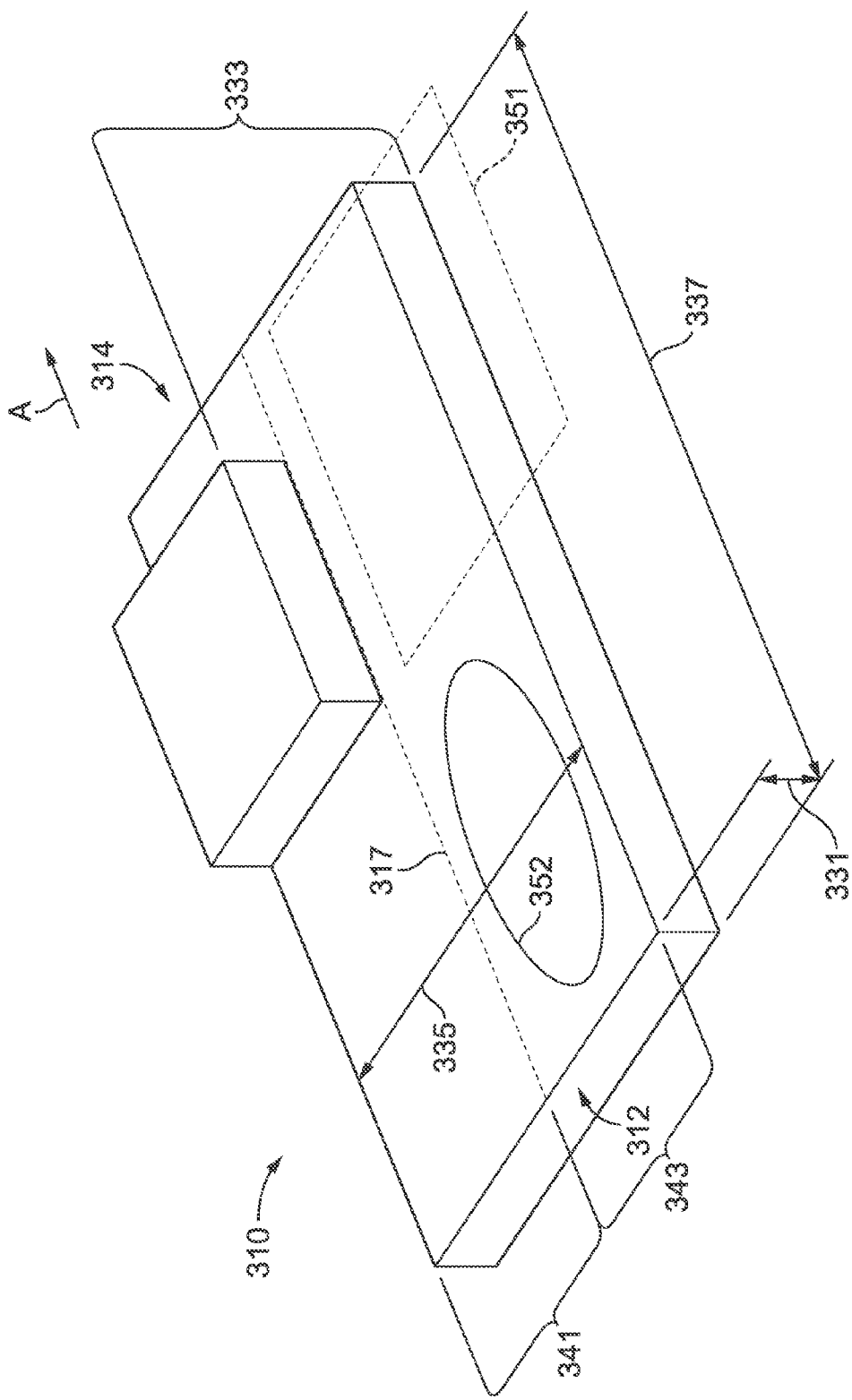
FIG. 8 illustrates a perspective view of a model for a 3-D envelope that may be defined by the various components on a card in accordance with an embodiment herein.

FIG. 8 illustrates a perspective view of a model for a 3-D envelope of a card that may be defined by the various components on a card in accordance with an alternative embodiment herein. In FIG. 8, a card 310 is illustrated having a connector mating end 312 and a chassis loading end 314 where the card 310 is loaded into a chassis in the direction of arrow A. The 3-D envelope of the card 310 has a width 335 and length 337. The card 310 extends along a longitudinal axis 317, and includes first and second lateral portions 341 and 343 separated from one another along a loading direction corresponding to the longitudinal axis 317. The first and second lateral sections 341 and 343 have different first and second heights 333 and 331, respectively. A height 331 of the lateral section 343 is defined by, and dimensioned to pass below, a lowest interfering component within the card receptacle. For example, a PCI card may be positioned within a chassis at a position in which a bottom surface of the PCI card lies within an area directly above the lateral section 343. Accordingly, a vertical height of the card receptacle within the area below the PCI card is used to define a height 331 of the lateral section 343, at least over the area in which the card 310 will be loaded to a position immediately below the PCI card.

For example, a crosshatched region 351 is illustrated in FIG. 8 to be representative of the lower surface of a PCI card. In order for the card 310 to fit below the PCI card, the lateral section 343 is constructed with a height 331 that fit below the lower surface of the PCI card (at 351). Optionally, components within the region at 352 of the card 310 may be constructed with a height greater than the height 331 given that the components within the region 352 need not pass below the lower surface of the PCI card at 351.

The lateral region 341 does not pass below the lower surface 351 of the PCI card and accordingly, is not limited to the same vertical height constraints. Instead, components, heat sinks and other structures within the lateral section 341 may be constructed with a different height (e.g. height 333) that is determined based on different height constraints within the card receptacle.

Embodiments herein provide an electronics card (e.g. an I/O card) that exhibits a stepped 3D rear profile as viewed from the rear end or chassis loading end 314. The 3D rear profile enables the I/O card to be loaded into a card receptacle while utilizing a select amount (e.g., maximizing) of a projected surface area of the components on the I/O card (e.g., maximizing a projected surface area of the heat sink), and while also satisfying EMI and mechanical constraints. The step in the 3D rear profile provides increased structural integrity and also enables a larger heat sink while providing direct insertion of the I/O card into a rear of the chassis.

Optionally, the electronics card 110 may be configured to be cold plugged or hot plugged into the chassis. When cold plugged, power is turned off to the electronics to which the card 110 is being connected. When hot plugged, power is turned off when the card is removed and power is turned back on when the card 110 is connected.

The electronics card may broadly encompass any type of electrical device that is plugged into another device. For example, the electronic card may be plugged into a computing device, an electronic device, equipment or other non-computing device, etc. The electronics card may be plugged into a server, a computer, tablet, phone, smart watch and the like. The chassis and motherboard may be constructed in accordance with various specifications and operated for various functions. For example, the motherboard may include a power connector to couple to a backplane (e.g., via connectors). In one example, motherboard may be designed to operate in compliance with the PCI Industrial Computer Manufacturers Group (PICMG), Advanced Telecommunications Computing Architecture (ATCA) Base Specification, PICMG 3.0Rev. 1.0, published Dec. 30, 2002, and/or later versions of the specification ("the ATCA specification"). Additionally, a backplane may also be designed to operate in compliance with the ATCA specification, although the present disclosure is not limited to only ATCA compliant boards and backplanes but may also apply to various other systems and devices, including but not limited to Compact Peripheral Component Interface (cPCI) compliant boards, VersaModular Eurocard (VME) compliant boards, or other types of industry standards governing the design and operation of backplanes and boards. In addition, this disclosure may also apply to proprietary boards and/or backplanes designed to operate in a modular platform system.

A base fabric interface on an ATCA compliant board is designed to support 10/100/1000 BASE-T Ethernet communication protocols ("Ethernet") over a base fabric. Ethernet associated communication protocols, for example, are described in the Institute of Electrical and Electronics Engineers (IEEE) standard 802.3ah-2004 Information technology—Telecommunications and information exchange between systems—Local and metropolitan networks—Specific requirements—Part 3: Carrier Sense Multiple Access with Collision Detection Access Method and Physical Layer Specifications, published Sep. 7, 2004, and/or later versions of the standard (the "Ethernet standard").

In one example, base fabrics may facilitate the routing of data and/or instructions between a board coupled to a backplane and a management and/or control board described in the ATCA specification as a "shelf manager controller" (ShMC). Data and/or instructions that may include, but are limited to, management and/or control instructions may be forwarded between a ShMC and a board over a base fabric in a backplane using Ethernet communication protocols. A switch fabric interface for an ATCA compliant board may be designed to support one or more communication protocols. These protocols are associated with and/or described by sub-set specifications to the ATCA specification and are typically referred to as the "PICMG 3.x specifications." The PICMG 3.x specifications include, but are not limited to, Ethernet/Fibre Channel (PICMG 3.1), Infiniband (PICMG 3.2), StarFabric (PICMG 3.3), PCI-Express/Advanced Switching (PICMG 3.4) and Advanced Fabric Interconnect/S-RapidIO (PICMG 3.5). In one example, one or more switch fabric interfaces designed to support a communication protocol associated with a PICMG 3.x specification may facilitate the forwarding of data and/or instructions between boards coupled to an ATCA backplane via a switch fabric.

Although illustrative example embodiments have been described herein with reference to the accompanying figures, it is to be understood that this description is not limiting and that various other changes and modifications may be affected therein by one skilled in the art without departing from the scope or spirit of the disclosure. In accordance with at least one embodiment herein, to the extent that mobile computing devices are discussed herein, it should be understood that they can represent a very wide range of devices, applicable to a very wide range of settings. Thus, by way of illustrative and non-restrictive examples, such devices and/ or settings can include mobile telephones, tablet computers, and other portable computers such as portable laptop computers.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

It is to be understood that the subject matter described herein is not limited in its application to the details of construction and the arrangement of components set forth in the description herein or illustrated in the drawings hereof. The subject matter described herein is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

It is to be understood that the above description is intended to be illustrative, and not restrictive. For example, the above-described embodiments (and/or aspects thereof) may be used in combination with each other. In addition, many modifications may be made to adapt a particular situation or material to the teachings herein without departing from its scope. While the dimensions, types of materials and coatings described herein are intended to define various parameters, they are by no means limiting and are illustrative in nature. Many other embodiments will be apparent to those of skill in the art upon reviewing the above description. The scope of the embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects or order of execution on their acts.

What is claimed is:

1. A system, comprising:
   a main circuit board including one or more main processors; and
   a chassis that holds the main circuit board, the chassis including a card receptacle having an interior envelope with a non-uniform shape as viewed from a loading direction, the non-uniform shape defined at least in part by a boundary constraint with respect to an interfering three-dimensional (3D) region that is allocated to receive another electronic component; and
   an electronics card to be loaded along the loading direction into the card receptacle, the electronics card comprising:
      a card circuit board having electronic components that include one or more processors, the electronic components accessible by the one or more main processors, the card circuit board having a chassis loading end; and
      a heat sink provided on the card circuit board and thermally coupled to the electronic components to dissipate heat therefrom, wherein the heat sink has a three-dimensional (3D) envelope having a stepped end profile as viewed from the chassis loading end, the stepped end profile shaped and dimensioned to match the non-uniform shape of the interior envelope of the card receptacle.

2. The system of claim 1, wherein the stepped end profile includes first and second lateral sections extending different first and second heights above the card circuit board, the first and second lateral sections separated from one another along a stepped edge extending in a direction corresponding to a longitudinal axis of the card circuit board, the longitudinal axis extending from the chassis loading end to a connector mating end of the card circuit board.

3. The system of claim 1, wherein the heat sink includes first and second block sections separated by a stepped edge extending in a direction of a longitudinal axis of the card circuit board, the longitudinal axis extending from the chassis loading end to a connector mating end of the card circuit board.

4. The system of claim 3, wherein the first and second block sections of the heat sink have different first and second heights extending upward from the card circuit board to form the stepped end profile along a top perimeter of the heat sink.

5. The system of claim 1, wherein the electronic components include input/output (I/O) conversion circuitry and the electronics card further comprises a board connector that includes a receptacle to mate with the main circuit board in the chassis.

6. The system of claim 5, wherein the board connector mates with the main circuit board in the chassis in a planar arrangement such that the card circuit board and the main circuit board are generally aligned in a common plane.

7. The system of claim 1, wherein the electronics card further comprises electromagnetic interference (EMI) shielding provided on the card circuit board, the EMI shielding including vent openings that are positioned to align with vent apertures in the chassis.

8. The system of claim 1, wherein the chassis includes a shroud surrounding the card receptacle, the shroud including vent apertures, the electronics card positioned to engage the shroud with the vent openings aligned with the vent apertures in the shroud when the electronics card is loaded into the card receptacle.

9. The system of claim 1, further comprising one or more receptacle ports located at a connector mating end of the main circuit board and an electromagnetic interference (EMI) isolation shell including a bottom shielding layer located proximate to the main circuit board, the EMI isolation shell including an EMI cage at least partially surrounding the one or more receptacle ports.

10. The system of claim 1, wherein the main circuit board and chassis represent a server and the electronics card represents an input/output card.

11. The system of claim 1, wherein the 3-D envelope corresponds to an outer perimeter of the heat sink when viewed from the chassis loading end.

12. A method, comprising:
   providing a main circuit board including one or more processors in a chassis that includes a card receptacle having an interior envelope with a non-uniform shape as viewed from a loading direction, the non-uniform shape defined at least in part by a boundary constraint with respect to an interfering three-dimensional (3D) region that is allocated to receive another electronic component; and
   providing an electronics card, the electronics card comprising a card circuit board having electronic components including one or more processors, the card circuit board having a chassis loading end;

providing a heat sink on the card circuit board and thermally coupling the heat sink to the electronic components to dissipate heat therefrom; and forming the heat sink with a three-dimensional (3D) envelope having a stepped end profile as viewed from the chassis loading end, the stepped end profile shaped and dimensioned to match the non-uniform shape of the interior envelope of the card receptacle.

13. The method of claim 12, wherein the stepped end profile includes first and second lateral sections extending different first and second heights above the circuit board, the first and second lateral sections separated from one another along a stepped edge extending in a direction corresponding to a longitudinal axis of the circuit board, the longitudinal axis extending from the chassis loading end to a connector mating end of the card circuit board.

14. The method of claim 12, wherein the forming includes forming the stepped end profile to include a 3D perimeter having a nonrectangular profile when viewed from the chassis loading end.

15. The method of claim 12, further comprising shaping the stepped end profile of along a 3D perimeter of the electronics card to satisfy boundary constraints that define an interior envelope of the card receptacle.

16. The method of claim 12, further comprising providing ventilation airflow for the electronics card through the chassis.

17. The method of claim 16, further comprising providing electromagnetic interference (EMI) shielding on the electronics card with vent openings through the EMI shielding, the vent openings aligning with vent apertures in the chassis for the ventilation airflow.

18. The method of claim 12, wherein the 3-D envelope corresponds to an outer perimeter of the heat sink when viewed from the chassis loading end.

19. An electronics card, comprising:

a circuit board having electronic components thereon, the electronic components including one or more processors, the circuit board having a chassis loading end; and a heat sink provided on the circuit board and thermally coupled to one or more electronic components to dissipate heat therefrom, wherein the heat sink has a three-dimensional (3D) envelope having a stepped end profile, as viewed from the chassis loading end, that is shaped and dimensioned to match a non-uniform shape of an interior envelope of a card receptacle as viewed from a loading direction., wherein the stepped end profile includes first and second lateral sections extending different first and second heights above the circuit board, the first and second lateral sections separated from one another along a stepped edge extending in a direction corresponding to a longitudinal axis of the circuit board, the longitudinal axis extending from the chassis loading end to a connector mating end of the card circuit board.

20. The electronics card of claim 19, further comprising electromagnetic interference (EMI) shielding provided on the circuit board, the EMI shielding including vent openings to provide ventilation of airflow for the electronics components.

21. The electronics card of claim 19, further comprising vent openings that are positioned to align with vent apertures in a chassis when the electronics card is loaded into a card receptacle in the chassis.

22. The electronic device of claim 19, wherein the 3-D envelope corresponds to an outer perimeter of the heat sink when viewed from the chassis loading end.

* * * * *